United States Patent [19]

Flynn

[11] Patent Number: 4,843,588

[45] Date of Patent: Jun. 27, 1989

[54] PROGRAMMABLE RADIO FREQUENCY COMMUNICATIONS DEVICE CAPABLE OF PROGRAMMING A SIMILAR DEVICE

[75] Inventor: Patrick J. Flynn, Lynchburg, Va.

[73] Assignee: General Electric Company, Lynchburg, Va.

[21] Appl. No.: 910,353

[22] Filed: Sep. 22, 1986

Related U.S. Application Data

[63] Continuation of Ser. No. 419,391, Sep. 17, 1982, abandoned.

[51] Int. Cl.⁴ .......................... G06F 13/00; H04B 1/16
[52] U.S. Cl. .................................. 364/900; 455/186; 364/300
[58] Field of Search ... 364/900 MS File, 200 MS File, 364/409; 455/151, 186, 4; 340/825.44, 825.52; 339/14 MS File

[56] References Cited

U.S. PATENT DOCUMENTS

| | | | |
|---|---|---|---|
| 3,988,716 | 10/1976 | Fletcher et al. | 364/200 |
| 4,109,309 | 8/1978 | Johnstone et al. | 364/900 |
| 4,124,888 | 11/1978 | Washburn | 364/200 |
| 4,180,855 | 12/1979 | Buedez | 364/200 |
| 4,287,601 | 9/1981 | Borg et al. | 455/186 |
| 4,309,755 | 1/1982 | Lanty | 364/200 |
| 4,339,793 | 7/1982 | Marenin | 364/200 |
| 4,354,252 | 10/1982 | Lamb et al. | 364/409 |
| 4,358,825 | 11/1982 | Kyu et al. | 364/200 |
| 4,396,978 | 8/1983 | Hammer et al. | 364/200 |
| 4,413,328 | 11/1983 | Videki, II | 364/900 |
| 4,454,577 | 6/1984 | Costantini et al. | 364/200 |
| 4,455,661 | 6/1984 | Qureshi | 364/200 |
| 4,503,513 | 3/1985 | Pogue, Jr. | 364/900 |
| 4,525,865 | 10/1985 | Mears | 455/186 |
| 4,556,958 | 12/1985 | Ueon | 364/200 |

FOREIGN PATENT DOCUMENTS

| | | |
|---|---|---|
| 0040544 | 11/1981 | European Pat. Off. |
| 1440073 | 6/1976 | United Kingdom |
| 1556785 | 11/1979 | United Kingdom |
| 2030825 | 4/1980 | United Kingdom |
| 2062415 | 5/1981 | United Kingdom |
| 1595471 | 8/1981 | United Kingdom |
| 2102250 | 1/1983 | United Kingdom |

OTHER PUBLICATIONS

Hallen, My TRS-80 Talks to my Cromemco 2-2, BYTE, Jun. 1980, pp. 88-94.
Titchener, Communicating in Two Directions, BYTE, Jun. 1980, pp. 96-106.

Primary Examiner—Gareth D. Shaw
Assistant Examiner—Adolfo Ruiz
Attorney, Agent, or Firm—Nixon & Vanderhye

[57] ABSTRACT

A computer controlled radio communications device (e.g. a radio) having functional characteristics such as operating frequencies (i.e. a "personality") determined, at least in part, by characteristic-defining stored digital data and having the ability to automatically transmit/receive such characteristic/defining stored digital data to/from a similar computer-controlled radio communications device so as to provide another device having similar functional characteristics (i.e. a "cloned" device). A special unidirectional data transfer wiring harness is preferably used in conjunction with externally accessible plug connectors on each device to temporarily effect the requisite interconnection between the devices during such a personality "cloning" process.

40 Claims, 3 Drawing Sheets

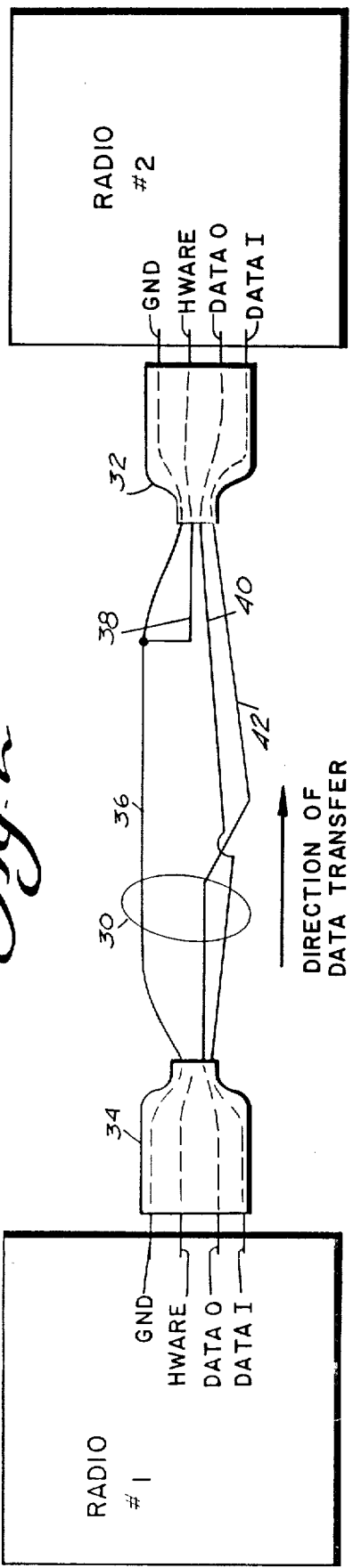
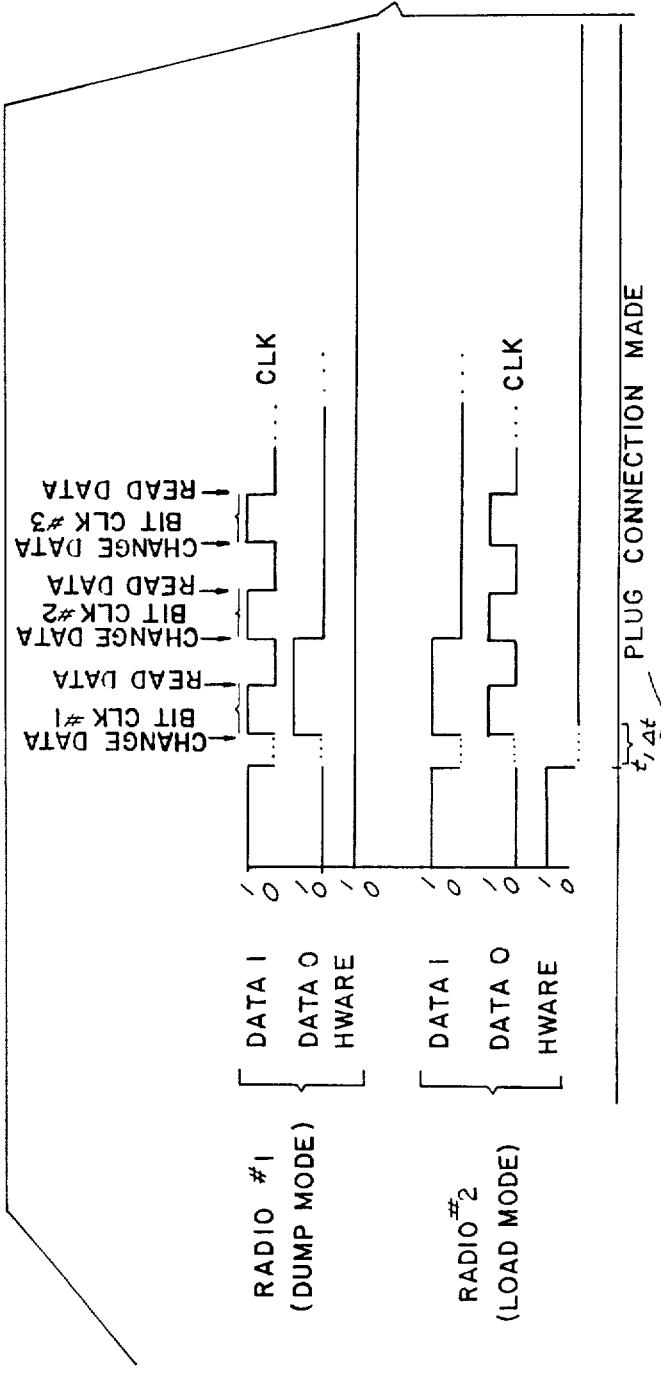

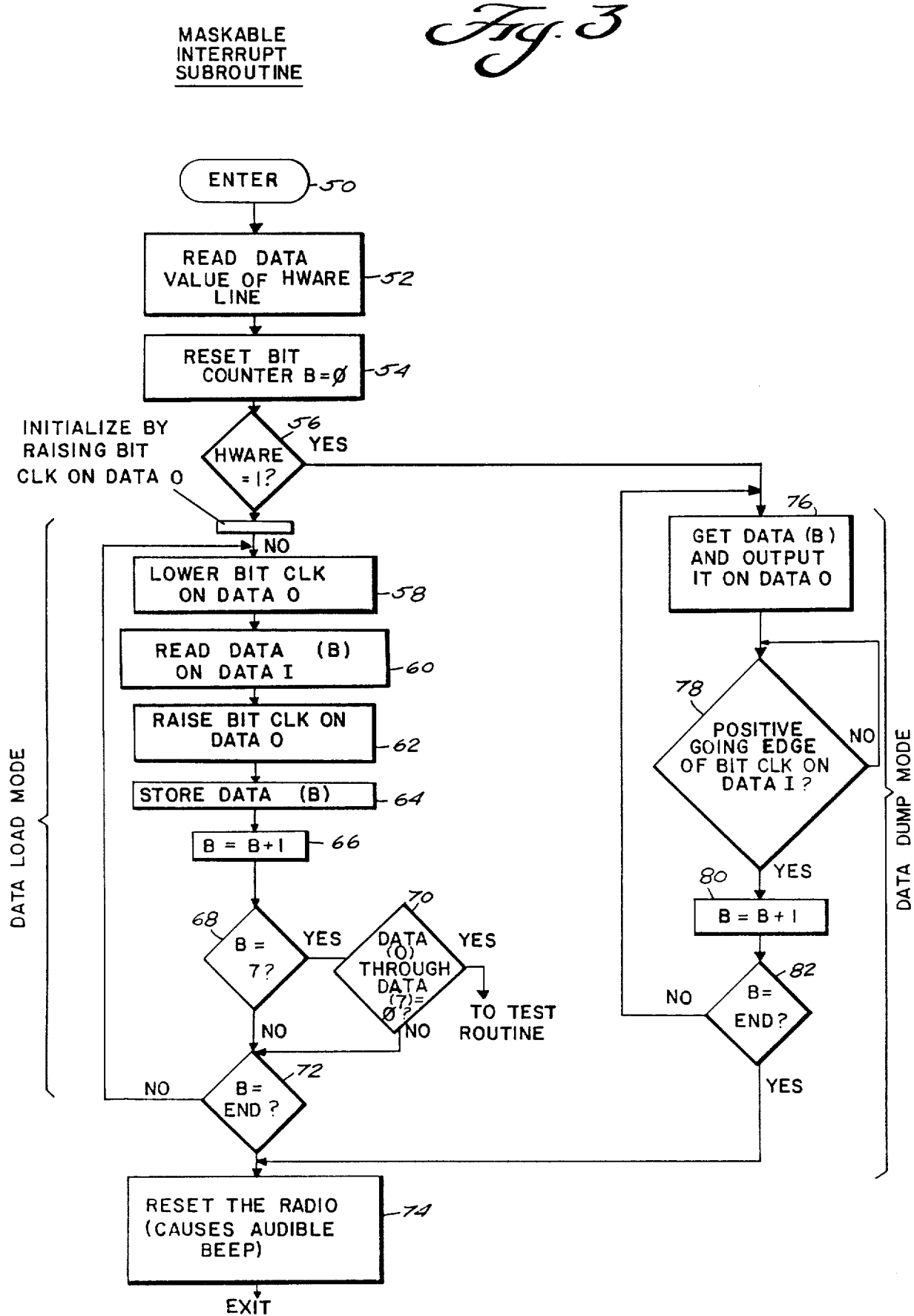

PROGRAMMABLE RADIO FREQUENCY COMMUNICATIONS DEVICE CAPABLE OF PROGRAMMING A SIMILAR DEVICE

FIELD OF THE INVENTION

This invention is generally directed to computer-controlled devices having functional characteristics (i.e. a "personality" ) determined, at least in part, by characteristic-defining stored digital data. In particular, the invention is directed to an improvement whereby each device is given the ability to automatically transmit/receive such characteristic/defining stored digital data to/from a similar computer-controlled device so as to provide yet another device having similar functional characteristics. By analogy to biological processes, the invention may be considered as providing a "cloning" ability to devices having a computer controlled personality.

BACKGROUND OF THE INVENTION

It is now commonplace (and becoming more so all the time) to provide computer-controlled devices having functional characteristics determined at least in part by characteristic-defining stored digital data within the device. For example, computer controlled radio communication devices may be provided wherein particular channel frequencies, encoder/decoder audio modulation tones (used for addressing purposes and the like), minimum volume settings, channel scanning patterns, etc. are defined by a particular pattern of stored digital data within a digital memory. In this way, radio equipment capable of performing a wide range of functions may have its unique "personality" defined for a particular functional installation by simply storing an appropriate pattern of characteristic-defining digital data in the appropriate digital memory of the radio.

The memory component used for storing such characteristic-defining digital data is typically of a substantially nonvolatile type (e.g. low power consuming CMOS memory circuits with automatic battery backup). The appropriate characteristic-defining digital data may be placed in the memory during the manufacturing process or in the field by users and/or distributors or the like.

Although by no means exhaustive, the following listing of prior issued U.S. Patents will provide an example of computer-controlled devices having functional characteristics determined, at least in part, by characteristic-defining stored digital data:

U.S. Pat. No. 3,835,384—Liff (1974);
U.S. Pat. No. 3,898,567—George (1975);
U.S. Pat. No. 3,924,192—George (1975);
U.S. Pat. No. 3,947,773—Christensen (1976);
U.S. Pat. No. 3,953,801—Podowski (1976);
U.S. Pat. No. 3,965,336—Grohmann (1976);
U.S. Pat. No. 3,968,444—Tenny (1976);
U.S. Pat. No. 4,017,800—Champagne (1977);
U.S. Pat. No. 4,031,491—Sakamoto (1977);
U.S. Pat. No. 4,114,100—Klank (1978);
U.S. Pat. No. 4,117,407—Kusakabe (1978);
U.S. Pat. No. 4,123,724—Das et al. (1978);
U.S. Pat. No. 4,131,853—Dreiske (1978);
U.S. Pat. No. 4,152,654—Tanaka (1979);
U.S. Pat. No. 4,155,043—Sakamoto (1979);
U.S. Pat. No. 4,223,352—Belisomi (1980);
U.S. Pat. No. 4,271,532—Wine (1981);
U.S. Pat. No. 4,287,601—Borg et al. (1981);
U.S. Pat. No. 4,320,386—Harris (1982).

So far as I am aware, all such prior art devices have required the use of a special programming unit to generate and store the characteristic-defining digital data in their appropriate digital memories. As will be appreciated, this represents the need for an additional special piece of equipment for many users of these devices which may only be utilized occasionally (e.g. when new devices are purchased or when it is desired to change the "personality" of an existing device to more closely resemble that of another existing device).

SUMMARY OF THE INVENTION

I have now discovered an economical way to provide each such device with the ability to automatically transmit/receive such characteristic stored digital data to/from a similar computer-controlled device so as to "clone" another device having a similar "personality" insofar as the functional characteristics controlled by such data are concerned. With this ability, users of such devices will hereinafter not have to invest in any further special purpose programming devices to merely transfer characteristic-defining data from one device to another. Accordingly, as soon as one device is available with the desired characteristic-defining data, all remaining devices within a user's system or subsystem may be quickly and easily reconfigured in the same way by briefly interconnecting them (preferably via a unidirectional data transfer wiring harness) with the first device.

In the presently preferred exemplary embodiment, this ability to "clone" additional devices having the same functional characteristics is realized by providing special purpose input/output/control bus connections between an externally accessible plug connector and the internal digital data processor which is conditioned by a special program subroutine. In the preferred exemplary embodiment, a unique unidirectional data transfer wiring harness is then plug-connected between two of these devices using the externally accessible plug connector just described. The specially conditioned data processor in each device then detects such an interconnection between devices and automatically assumes the appropriate data loading mode or data dumping mode (depending upon the orientation of the wiring harness). The device in the data dumping mode then proceeds under control of the other device to read and transfer duplicate characteristic-defining data thereto. At the same time, the device in the data loading mode automatically proceeds to request, accept and store such characteristic-defining digital data.

When applied to radio communication devices, the provision of this special purpose load/dump bus plug connector on each device will permit the "personality" features of one radio device to be copied directly into another through an appropriate wiring harness. This will add a new degree of flexibility to field programming abilities and will permit many field programming problems to be solved without requiring the use of a separate special purpose personality programming unit in the field.

BRIEF DESCRIPTION OF THE DRAWINGS

These as well as other objects and advantages of this invention will be more completely understood and appreciated by careful reading of the following detailed description of the presently preferred exemplary embodiment and the accompanying drawing, of which:

FIG. 2 is a schematic illustration of two radio devices of the type shown in FIG. 1 interconnected by a unique unidirectional data transfer wiring harness used to effect automatic transfer of characteristic-defining stored digital data from radio device number 1 to a similar radio device 2;

FIG. 3 is a flow chart of the maskable interrupt code included in the program of the digital data processor utilized in the radio devices of FIGS. 1 and 2; and FIG. 4 is a timing diagram useful in explaining the data transfer process effected by the subroutine of FIG. 3 between the radio devices of FIGS. 1 and 2.

DETAILED DESCRIPTION OF PREFERRED EMBODIMENTS

Figure 1:
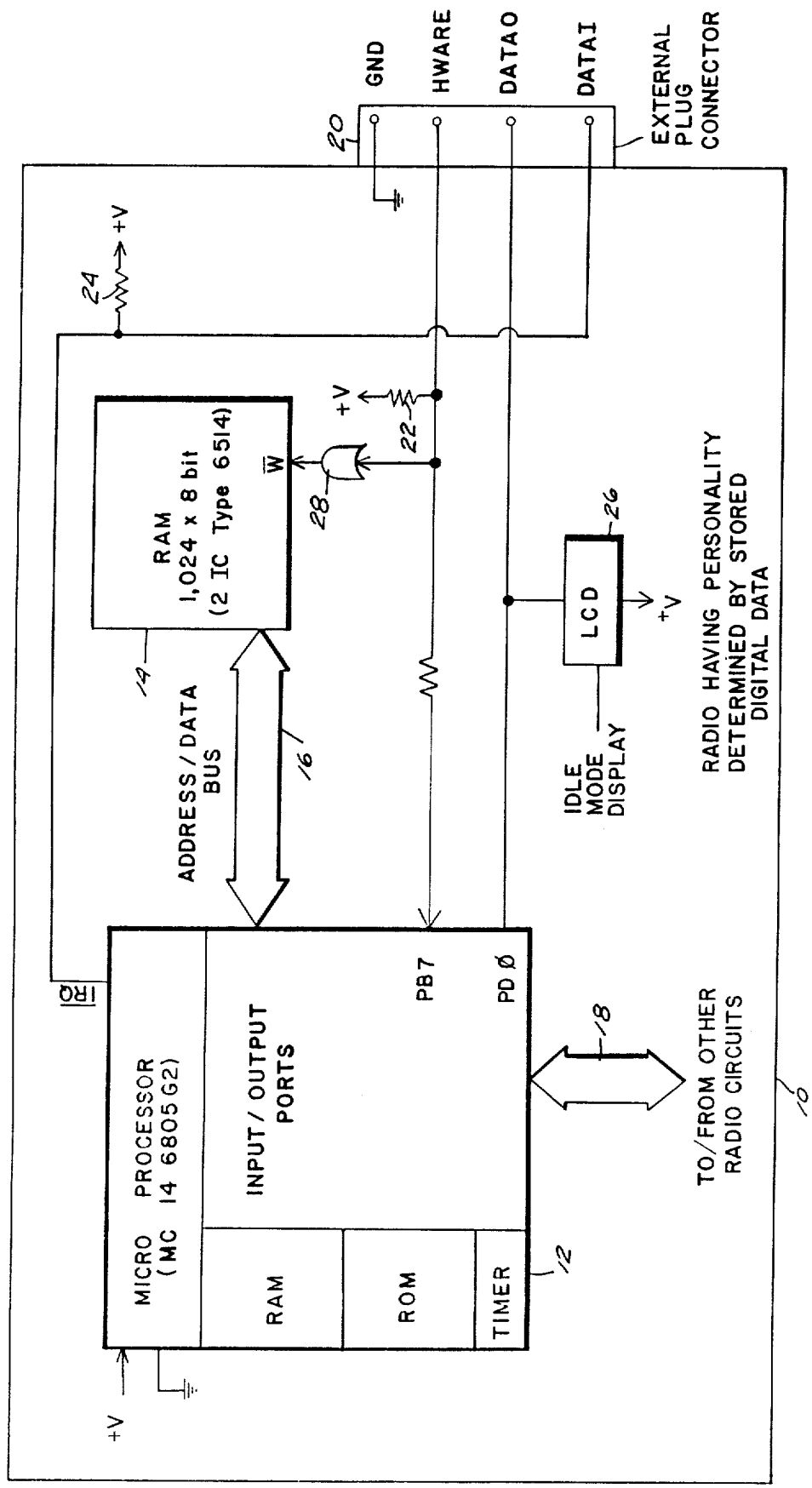
FIG. 1 is a schematic diagram of a radio device having personality features determined by stored digital data and, in accordance with this invention, also having the ability to automatically transmit/receive such characteristic-defining stored digital data to/from a similar radio device.

The radio device 10 shown in FIG. 1 includes a conventional digital data processor 12 (e.g. a Motorola MC 146805G2) and a conventional digital data memory 14 (e.g. two Harris type 6514 integrated circuits) 16. The exemplary data processor 12 is a microprocessor of the type which includes internal random access memory (RAM), read only memory (ROM), timer circuits and input/output portions as depicted in FIG. 1. As should be recognized, other types of microprocessor circuits (e.g. a collection of separate conventionally interconnected integrated circuit chips for the processor, program memory, I/O ports, etc.) could also be used. The data processor 12 is conventionally supplied with operating electrical potential as depicted in FIG. 1 and is conventionally programmed so as to interact with other radio circuits via I/O ports 18. For example, via ports 18, the microprocessor 12 may sense the output of various tone decoders, may control tone encoders and tone decoders, may control audio volume, transmitter circuits, channel scanning circuitry, etc. In short, the overall "personality" of the radio device is substantially controlled by the microprocessor 12. (Of course, there may be some fixed personality features of the radio device which are not alterable by the data processor 12.)

To appropriately control the personality functions of the radio device, the data processor 12 is conventionally programmed to access characteristic-defining digital data stored in the RAM 14 (typically low current drain CMOS circuitry with automatic battery backup). For example, if a particular digital word in RAM 14 has a particular predetermined configuration, then the microprocessor 12 may cause a certain sequence of audio tones to be encoded and/or decoded by the radio circuits when the operator actuates a given switch or when a new carrier signal is first received, etc. Similarly, other digital words in RAM 14 can cause the microprocessor 12 to tune the radio filter circuits so as to permit reception and/or transmission of carrier frequency signals on a particular channel frequency, etc. Since this manner of effecting control over the "personality" of radio and/or of other computer controlled devices is conventional and well known in the art, no further detailed description of such features is needed for the understanding and practice of this invention.

In addition to the conventional components and functions just described, the radio device of FIG. 1 includes a special externally accessible plug connector 20. In the exemplary embodiment, plug connector 20 includes a ground connection (GND), a special control connection (HWARE) to an input port of the data processor 12 (e.g. PB7), a data output connection (DATAO) to an ouput port of the data processor 12 (e.g. PD$\emptyset$), and a data input connection (DATAI) to the interrupt terminal of the microprocessor 12 (e.g. IRQ). Alternatively, the data input connection could be to a separate data input port of the data processor 12 although this would not provide the preferred interrupt capability for the data transfer function.

In the exemplary embodiment depicted in FIG. 1, the HWARE and DATAI terminals are normally held at a high voltage level (binary data value "1") by resistances 22 and 24 respectively which are connected to the voltage supply as shown. The data output port PD$\emptyset$ in the exemplary embodiment is normally maintained at a low voltage level (e.g. a binary data value of "$\emptyset$") and is also used to drive, among other things, the "idle" mode display (e.g. LCD 26) as also depicted in FIG. 1

The output of OR gate 28 is connected to the WRITE input of RAM 14 and is used to provide memory protection. In particular, if any of the inputs or OR gate 28 is high, then the WRITE input to RAM 14 is conditioned so as to prevent the writing of any digital data into its memory circuits. As depicted in FIG. 1, one input of OR gate 28 is connected to the normally high voltage HWARE control line. Accordingly, whenever, the HWARE control line is grounded, it will be possible to WRITE into the RAM 14.

To effect the transfer of characteristic-defining digital data from RAM 14 in one device 10 to another similar device, their respective external plug connectors 20 are interconnected by a unidirectional data transfer wiring harness 30 as shown in FIG. 2. Here, the wiring harness 30 is connected with its data receiving end 32 connected to radio device 2 and its data transmitting end 34 connected to a similar radio device 1. Both radio devices in this exemplary embodiment have identical hardware architectures of the type shown in FIG. 1. However, the characteristic-determining stored data in RAM 14 of radio 1 is initially different from that stored in the memory device of radio 2 and it is desired to change this situation so as to cause radio 2 to have the same "personality" or characteristic functional attributes as radio 1.

As may be seen in the FIG. 2 showing of wiring harness 30, the GND leads of both radios are interconnected by conductor 36. The control HWARE connection at radio 1 is left open circuited (i.e. at the transmitting end 34) but this same lead is shorted to ground via conductor 38 at the data receiving end 32 of harness 30. The remaining conductors 40 and 42 of the harness 30 effect transposed electrical connections between the DATAO terminal of radio 1 and the DATAI terminal of radio 2 on the one hand and between the DATAI terminal of radio 1 and the DATAO terminal of radio 2 on the other hand.

In the exemplary embodiment, microprocessor 12 has a maskable interrupt capability. In particular, anytime the IRQ terminal of microprocessor 12 is forced to a low voltage level, then the normal execution sequence of programmed instructions is altered by transfer to the maskable interrupt program depicted in the flow chart of FIG. 3. Alternatively, the executive program used by microprocessor 12 could be devised so as to periodically monitor a special control input to one of its input- /output ports so as to detect an operator request (e.g. via switch, jumper wire connection, etc.) to enter a special "cloning" code of the type shown in FIG. 3. However, in the presently preferred exemplary embodiment depicted in FIGS. 1 and 2, since the I/O port PD0 is normally maintained at a low voltage level, the mere interconnection of the special wiring harness 30 will immediately cause the DATAI terminal of the connector 20 on each of the radios to go a low voltage level and thus cause the microprocessor of each of the interconnected devices to immediately transfer to the "cloning" subroutine of FIG. 3.

Once the subroutine of FIG. 3 is entered at 50, the existing data value of the control HWARE line is immediately read at 52. Alternatively, the subroutine of FIG. 3 could initially enter a wait loop for a fixed time (or until an operator switch is actuated) to insure that connectors are firmly in place before the main body of the subroutine is executed.

As should be appreciated from FIGS. 1 and 2, the HWARE line of radio 1 will remain in its high "1" bit value status while the HWARE line of radio 2 is forced to a low 0 bit value status by the short to ground via conductor 38 of the wiring harness 30. Thus, the internal electrical control connections associated with the ends 32 and 34 of the unidirectional transfer wiring harness 30 make the two ends electrically distinguishable from one another by each of the interconnected radio devices.

A bit counter B is reset to zero at 54 in the flow chart of FIG. 3 and any other necessary initializing conditions for the particular subroutine to be employed may also be effected at this point in the flow chart.

A test of the previously read HWARE data value is made at 56 in the flow chart of FIG. 3. If the bit value is "1" (as it will be for the data transmitting device in the exemplary embodiment), a branch is made to a data dump mode shown at the righthand side of FIG. 3. Otherwise, control is transferred to a data load mode segment of the subroutine as also depicted in FIG. 3.

As should now be appreciated, in the exemplary embodiment, the data receiving device will branch to the data load mode. Accordingly, in the exemplary embodiment, immediately upon interconnection of radio devices 1 and 2 by the wiring harness 30, each of their respective data processors will be substantially immediately interrupted and, depending upon the directional orientation of the wiring harness 30, the data processor in one of the devices will be placed in a data dump mode while the data processor of the other device will be placed in the data load mode.

The exemplary embodiment is arranged so that the data receiving device sends successive bit clocking signals from its DATAO terminal to the DATAI terminal of the other device. In response, the data transmitting device reads successive bits of its characteristic-determining stored digital data and generates corresponding bit valued signals at its DATAO terminal which are then presented via the wiring harness 30 to the DATAI terminal of the data receiving device. This interactive exchange of bit clocking and data bit value signals between the two devices continues in rapid succession until all of the stored data bit values from the transmitting device have been nondestructively read and transferred to corresponding locations in a similar digital memory of the data receiving device. It should be noted that because of the memory protect feature associated with OR gate 28 and because of the non-grounded condition of the control HWARE line at the data transmitting device, the memory circuits of the transmitting device are protected from any inadvertant writing thereinto.

A more detailed understanding of this interactive data transfer process may be had by now considering the data load and data dump mode sections of the subroutine depicted in FIG. 3.

In the data load mode, a bit clocking signal is initiated at 58 e.g. by lowering the voltage level on the DATAO terminal (if not already lowered). Thereafter, the data value appearing on the DATAI terminal is read at 60. Then a request for an additional data bit is effected (e.g. by raising the voltage level of the bit clocking signal on the DATAO terminal at 62). The just previously read data value is stored at a properly indexed memory position (e.g. indexed by the bit counter B) at 64. The bit counter is then incremented at 66 and special tests are made at 68 and 70 to detect a possible request for transfer to a test routine (these steps may be omitted if no test routine is employed or if some other technique for entering the test routine is provided.)

In the exemplary embodiment, the characteristic-defining data stored in RAM 14 normally includes at least one nonzero bit value within the first eight bits of the memory. Accordingly, as soon as the first eight bits have been read from the DATAI input terminal (as detected at 68), they are checked for a constant zero value (at 70). If all zero values are detected, then this is an indication that a special purpose test apparatus has been connected to the plug connector 20 and that a special test code is to be entered. For purposes of understanding the present invention, the details of such a test code are not necessary.

In the absence of a special request for the test code, a check will be made at 72 to see if the requisite number of data bits have yet been received and stored. If not, transfer is made back to block 58 for another cycle of operation in the data load mode. On the other hand, if all of the characteristic-defining data bits have now been transferred, then control is passed to box 74 where the radio is reset such that its subsequent operation with new personality data will begin from a desired starting condition (e.g. previously set tone encoder/decoder, frequency filters and the like may be reset to an inactive or other common starting condition).

In the exemplary embodiment, resetting the radio also causes an audible beep to the operator which can be used as a positive indication that the desired data transfer process has been completed and that the wiring harness 30 may be disconnected. In addition, it should be noted that the LCD display 26 will provide a continuously changing visual indication of the ongoing data transfer process since the DATAO terminals on both radios will normally be changing between low and high voltage levels during the data transfer process.

In the exemplary embodiment, the interrupt terminal IRQ of the microprocessor 12 is also used as the data input terminal for this special type of data transfer. This dual function for the interrupt line is made possible because microprocessor 12 used in the exemplary embodiment has a maskable interrupt feature which permits it to ignore subsequent interrupt requests until the interrupt code has been completely exited and the masking bit reset. In the meantime, however, the exemplary microprocessor has an instruction set which includes conditional branch instructions depending upon the high or low condition of the interrupt line. Accordingly, data values can be effectively "read" from the high or low voltage level of the interrupt line during execution of the maskable interrupt subroutine of FIG. 3 by performing these branch instructions. If a branch is effected indicating a high voltage level on the interrupt line, then this can be interrupted as a "1" bit value. On the other hand, if that branch is not made (or if another branch is executed because the interrupt line is low), then this may be taken to represent a "0" bit value. This technique of monitoring the value of the interrupt line during execution of a maskable interrupt subroutine is believed to be conventional per se in the digital processing arts and thus needs no further description here.

If the microprocessor branches to the data dump mode shown in FIG. 3, then a properly indexed data bit value is read from the RAM 14 (e.g. as indexed by the bit counter B) and presented as an appropriate output data level on its DATAO terminal at 76. Thereafter, a wait loop is entered at 78 until the next positive-going edge of the bit clocking signal is detected at the DATAI terminal. Once that positive going edge of the bit clocking signal is detected, the bit counter is incremented at 80 and a test is made at 82 for the end of the data transfer process. Until the end of the data control process is reached, transfer is looped back to box 76 of the data dump mode portion of the subroutine shown in FIG. 3. Upon completion of the data transfer process, control is passed to box 74 where the radio is reset, etc. as previously described.

To briefly recap, once the radio devices are interconnected as shown in FIG. 2, the data recipient device enters a data load mode of operation while the data transmitting device enters a data dump mode of operation. Thereafter, the data recipient generates bit clocking pulses at its DATAO terminal which are received and used for control purposes at the DATAI terminal data transmitting device. Successive bit values are then fetched from the memory of data transmitting device and transmitted via its DATAO terminal to the DATAI terminal of the recipient device. In general, once the data transfer process has begun, new data values are output from the transmitting device on each positive-going clock pulse edge while data values are inputed to the recipient device at each negative-going clock transition.

This process is graphically depicted at the timing diagram of FIG. 4. Initially, the DATAO terminals of both devices are in their normal low level ("0") status (due to conventional programming of the data processors 12) while the DATAI terminals are in a normally high level ("1") as are the HWARE lines of both devices. Then, at time t1 the plug connection of wiring harness 30 is completed between both radios. This immediately causes the DATA I terminals of both devices to go low and, after some time interval delta t, radio 1 will enter its dump mode while radio 2 will enter its load mode. Thus, radio 2 generates successive positive and negative going bit clocking level transitions at its DATAO terminal which are connected to the DATAI terminal of radio 1. At the same time, successive data bit level values are transmitted from the DATAO terminal of radio 1 to the DATAI terminal of radio 2. For the exemplary process depicted in FIG. 4, bit values "100 . . ." would be transferred.

As will be noted in the exemplary embodiment, the harness 30 should not be connected between devices unless both devices are in their "idle" mode with DATAI terminals at a low voltage level —as can be visually checked by LCD 26. Interconnection of harness 30 substantially simultaneously will cause an interrupt in both devices and a transfer to the "cloning" code of FIG. 3. Alternatively, another wait loop can be incorporated in the data load mode program or in the common initial portion of the "cloning" code so as to insure that both devices are plug connected and fully ready to execute the data transfer process before actually entering the data load/dump mode operation. If desired, some initial signal "handshake" sequence or the like could also be incorporated in the FIG. 3 code for this purpose before branching to the load or dump mode portions of the program. Switched connections could also be incorporated in harness 30 to insure simultaneous interruption of both connected devices as should by now be apparent.

Although only one presently preferred exemplary mode of this invention has been described in detail above, those skilled in the art will recognize that there may be many modifications and variations of this exemplary embodiment which nevertheless retain many of the novel advantages and features of this invention. For example, there are many different interrupt and/or signal monitoring techniques that may be employed by the data processors to detect the request for this type of data transfer. Furthermore, the data transfer can be effected in many different specific ways via dedicated input/output ports, I/O ports having shared usage, special purpose control terminals (possibly also having shared usages), etc. Many different types of data transmitting protocols and/or clocking protocols may also be utilized. The detailed sequences of operations in the data load/dump mode may also take many different forms. Accordingly, all such variations and modifications are intended to be within the scope of the following appended claims.

What is claimed is:

1. A first computer-controlled digital radio communications device having functional characteristics determined, at least in part, by characteristic-defining stored digital data and having the ability to automatically transmit/receive said characteristic-defining digital data to and from another computer-controlled digital radio device to provide said first and another digital radio communications devices with digital programming defining substantially identical functional characteristics, and first digital radio communications device comprising:
   digital data processor means for performing control functions in response to digital data,
   digital data memory means connected to said data processor means for storing said characteristic-defining digital data and for determining, at least in part, said control functions to be performed by said data processor means,
   data input, output and control connections between said data processor means and an external multi-conductor connector,
   said data processor means being programmed to selectively operate in either of the following special operational modes:
   (a) to read and output via said connections said characteristic-defining digital data to said another digital radio communications device, or
   (b) to accept and store via said connections said characteristic-defining digital data provided by said another digital radio communications device; and a unidirectional data transfer wiring harness means for interconnection between said external multiconductor connector and the external multi-conductor connector of said another digital radio communications device, said wiring harness means for transferring said characteristic-defining stored digital data between said digital data memory means and said another digital radio communications device so as to cause both said first and said another digital radio communications devices to operate substantially identically, said wiring harness means comprising:

a data receiving end connector;

a data transmitting end connector, each of said data transmitting end connector and data receiving end connector capable of being electrically connected to either of said first digital radio communications device and said another digital radio communications device; and internal electrical conductors connected to said control connections of at least one of said data transmitting end connector and said data receiving end connector, said data processor means including means for electrically distinguishing said data transmitting end connector from said data receiving end connector.

2. A computer-controlled device as in claim 1 wherein said data processor means is of a type which can be interrupted and wherein said data input, output and control connections comprise:

a mode-controlling input connection to an I/O port of said data processor means;

an interrupt connection to an interrupt terminal of said digital data processor means, said processor means including means for selectively interrupting its normal operation and branching to one of said special operational modes depending upon the instantaneous status of said mode-controlling input connection; and a data output connection to an I/O port of said data processor means.

3. A computer-controlled device as in claim 2 wherein:

said interrupt connection also serves as a data input connection after the data processor means has been interrupted.

4. A computer-controlled device as in claim 3 wherein said data processor means is programmed (a) to read and output on said data output connection successive bits of said characteristic-defining digital data in response to corresponding successive bit clocking signals received on said data input connection in the first above-mentioned special operational mode, and (b) to supply successive bit clocking signals on said data output connection and to accept and store from said data input connection successive bits of said characteristic-defining data in the second above-mentioned special operational mode.

5. A pair of interconnected computer controlled devices as in claim 1 wherein said internal electrical conductors connected to said control connections includes a short circuit therebetween at one of said ends.

6. Uni-directional data transfer wiring apparatus for temporarily interconnecting first and second digital radio communications devices each of the type including means for storing digital data and each further including radio frequency transceiving means for transmitting and receiving radio frequency signals in accordance with characteristic-defining digital data stored in the digital data storing means thereof, said wiring apparatus for automatically transferring said characteristic-defining stored digital data from one of said first and second digital radio communications device to the other of said first and second digital radio communications devices so as to provide two digital radio communications devices having substantially identical transmitting and receiving functions, said wiring apparatus comprising:

a cable having a first end and a second end;

a data receiving end connector connected to said cable first end;

a data transmitting end connector connected to said cable second end;

each of said connectors being capable of electrically connecting to either said first or said second device;

internal electrical control connection means associated with at least one of said first and second ends for making said first and second ends electrically distinguishable from one another by each of said first and second devices, said control connection means including input/output connection transposing means for transposing electrical signals output from one of said first and second radio frequency communications devices to the input of the other of said first and second devices and vice versa.

7. Unidirectional data transfer wiring apparatus as in claim 6 further comprising manual switch means for triggering the initiation of a data transfer cycle.

8. A computer controlled radio communication device having at least some operational characteristics determined by stored characteristic-defining digital data and comprising:

radio frequency circuit means for transmitting and/or receiving radio frequency signals on radio frequency channels being determined at least in part by said stored characteristic-defining digital data;

a digital data processing means having input, output, control and ground terminals and connected to said circuit means, for controlling operations of said circuit means in accordance with characteristic-defining digital data stored in a digital data memory means;

said digital data memory means connected to said data processing means for storing characteristic-defining digital data and applying said stored characteristic-defining digital data to said processing means;

a bidirectional data transfer connector means having at least four externally accessible connectors for individually making the following four electrical connections internally of said device:

(a) a ground electrical reference connection electrically connected to said data processing means ground terminal, (b) a control connection electrically connected to said data processing means control terminal, (c) a data input connection electrically connected to said data processing means input terminal, and (d) a data output connection electrically connected to said data processing means output terminal, and interconnection means connected to said bidirectional data transfer connector means for connecting said device to a further computer controlled radio communication device also having a digital data memory means, radio frequency circuit means, digital data processing means and a bidirectional data transfer connector means and for transferring said stored characteristic-defining digital data between said device and said further device to cause at least some operations of said radio frequency circuit means of said first and further devices to be substantially identically to one another in response to said transferred characteristic-defining digital data;

said data processing means being programmed to selectively, alternately perform the following functions:
(a) read and output said stored characteristic-defining digital data to the memory means of said further similar computer controlled radio communication device interconnected thereto via said interconnection means; and
(b) accept and store said stored characteristic-defining digital data from the memory means of said further device interconnected thereto via said interconnection means.

9. A computer controlled radio communication device as in claim 8 wherein said data processing means includes means for selectively performing the reading and outputting function or the accepting and storing function depending upon whether said control connection is electrically grounded.

10. A computer controlled radio communication device as in claim 8 and 9 wherein said data processing means includes means for selectively performing the reading and outputting function or the accepting and storing function in response to sensing the electrical grounding of said data input connection.

11. A computer controlled radio communication device as in claim 8 or 9 wherein said data processing means includes means for supplying successive bits of said stored digital data at said data output connection in response to receipt of corresponding successive bit clocking signals at said data input connection.

12. A computer controlled radio communication device as in claim 8 or 9 wherein said data processing means includes means for supplying successive bit clocking signals at said data output connection and for accepting and storing corresponding successive bits of digital data presented thereto at said data input connection.

13. A computer controlled radio communication device as in claim 8 or 9 wherein said data processing means includes:
an interrupt terminal,
means for executing an interrupt control subroutine in response to an initial change in electrical status of said interrupt terminal,
means connected to said interrupt terminal for monitoring the electrical status of said interrupt terminal and for utilizing the interrupt terminal electrical status as digital input data after said executing means executes said interrupt control subroutine and plural digital data input/output terminals,
said control connection being connected to one of said input/output terminals;
said data output connection being connected to another of said input/output terminals; and
said data input connection being connected to said interrupt terminal.

14. A computer controlled radio communication device as in claim 13 wherein data processing means includes:
means for transferring program control to a special interrupt program subroutine whenever said data input connection is grounded
means for testing the status (grounded or ungrounded of said control connection;
means connected to said testing means for supplying successive bit clock signals on said data output connection if said testing means reveals said control operation is grounded and for accepting and storing in the memory means corresponding successive bit data signals received on said data input connection; and
means connected to said testing means for reading and supplying from said memory means corresponding successive bit data signals onto said data output connection in response to successive bit clock signals received on said data input connection if said testing means reveals said control connection is ungrounded.

15. A method for automatically transferring characteristic-defining stored digital data including radio frequency control data between similar digital radio communications devices having functional characteristics including radio operating frequencies determined, at least in part, by such characteristic-defining stored digital data so as to provide two devices having similar functional characteristics including radio operating frequency characteristics, said method comprising:
providing in each device data input, output and control connections between a data processor means and an external multi-conductor connector,
programming said data processor means in each device to selectively operate in either of the following special operational modes both of which cause said communications devices to operate on the same preprogrammed radio frequencies:
(a) to read and output via said connections said characteristic-defining digital data to memory means of the other similar device; and
(b) to accept and store via said connections said characteristic-defining digital data from the memory means of the other similar device; and
transmitting and/or receiving radio frequency signals having a frequency controlled in response to said accepted and stored characteristic-defining digital data.

16. A method as in claim 15 wherein the data processor means is of a type which can be interrupted and has an interrupt terminal and wherein said data input, output and control connections each include a mode-controlling input connection to an I/O port of said data processor means, said mode-controlling input connection having an instantaneous status, and further comprising:
selectively interrupting the processor means from its normal operation and causing it to branch to one of said special operational modes depending upon the instantaneous status of said mode-controlling input connection.

17. A method as in claim 15 wherein said data processor means includes:
(a) means for reading and outputting to said data output connection successive bits of said characteristic-defining digital data in response to corresponding successive bit clocking signals received on a data input connection in the first special operational mode, and (b) means for supplying successive bit clocking signals on said data output connection and for accepting and storing from said data input connection successive bits of said characteristic-defining data in the second special operational mode.

18. A method for automatically transferring characteristic-defining stored digital data between similar computer controlled radio communication devices each including radio frequency circuit means for transmitting and receiving radio frequency signals under control of stored characteristic-defining digital data, a digital data processing means having input, output, control and ground terminals, said processing means for controlling the operation of said radio frequency circuit means, digital data memory means connected to said data processing means for storing said characteristic-defining digital data, and a bidirectional data transfer connector having at least four externally accessible connectors individually making the following four electrical connections internally of said device: (a) a ground electrical reference connection electrically connected to said data processing means ground terminal, (b) a control connection electrically connected to said data processing means control terminal, (c) a data input connection electrically connected to said data processing means input terminal, and (d) a data output connection electrically connected to said data processing means output terminal, said method comprising the steps of:
programming said data processing means to selectively, alternately:
(a) read said characteristic-defining digital data from said digital data memory means and output said read characteristic-defining digital data to a further computer controlled radio communication device interconnected thereto via said externally accessible connectors; and
(b) accept said characteristic-defining digital data stored in said further similar, preprogrammed radio communications device interconnected thereto via said externally accessible connectors and store said characteristic-defining digital data into said memory means, so as to cause said device and said further device to store substantially identical characteristic-defining data; and controlling at least one operating parameter of said radio frequency circuit means in accordance with said stored characteristic-defining digital data.

19. A method as in claim 18 wherein said data processing means includes means for selectively alternately reading and outputting said stored data or accepting and storing said stored data depending upon whether said control connection is electrically grounded.

20. A method as in claim 18 or 19 wherein said data processing means includes means for selectively reading and outputting said stored data or accepting and storing said stored data in response to sensing the electrical grounding of said data input connection.

21. A method as in claim 18 or 19 wherein said data processing means includes means for supplying successive bits of said stored digital data at said data output connection in response to receipt of corresponding successive bit clocking signals at said data input connection.

22. A method as in claim 18 or 19 wherein said data processing means includes means for supplying successive bit clocking signals at said data output connection and for accepting and storing corresponding successive bits of digital data presented thereto at said data input connection.

23. A method for communicating digital signals comprising the steps of:
(1) connecting an electrical connector terminating a first end of a uni-directional wiring harness to a mating electrical connector of a first digital signal processor-controlled device,
(2) connecting a further electrical connector terminating a further end of said wiring harness to a mating electrical connector of a second digital signal processor-controlled device, said electrical connector terminating said wiring harness first end being substantially mechanically identical to said further electrical connector terminating said wiring harness further end, said first device mating connector being substantially mechanically identical to said second device mating connector, said first device mating connector capable of mating with either of said electrical connector terminating said wiring harness first end or said further electrical connector terminating said wiring harness further end, said second device mating connector capable of mating with either of said electrical connector terminating said wiring harness first end and said further electrical connector terminating said wiring harness further end,
(3) transmitting characteristic-defining digital signals from one of said first and second devices to the other of said first and second devices via said wiring harness,
(4) electrically testing, with said first device, whether the electrical connector connected to first device mating connector has a certain electrical characteristic possessed by only one of said electrical connector terminating said wiring harness first end and said further electrical connector terminating said wiring harness further end,
(5) transmitting characteristic-defining data signals onto said wiring harness with said first device if said testing step (4) reveals said electrical connector connected to said first device mating connector has said certain electrical characteristic, and otherwise receiving characteristic-defining data signals from said wiring harness with said first device;
(6) electrically testing, with said second device, whether the electrical connector connected to second device mating connector has said certain electrical characteristic; and
(7) transmitting characteristic-defining data signals onto said wiring harness with said second device if said testing step (6) reveals said electrical connector connected to said second device mating connector has said certain electrical characteristic, and otherwise receiving characteristic-defining data signals from said wiring harness with said second device.

24. A system for communicating data signals between a first and second digital signal processor-controlled device comprising:
a uni-directional wiring harness having a first end a further end, an electrical connector terminating said first end of said wiring harness, a further electrical connector terminating said further end of said wiring harness, said electrical connector terminating said wiring harness first end being substantially mechanically identical to said further electrical connector terminating said wiring harness further end;

a first digital signal processor-controlled device including a mating electrical connector, said first device mating connector capable of mating with either of said electrical connector terminating said wiring harness first end and said further electrical connector terminating said wiring harness further end;

a second digital signal processor-controlled device including a mating electrical connector, said second device mating connector being substantially mechanically identical to said first device mating connector, said second device mating connector capable of mating with either of said electrical connector terminating said wiring harness first end and said further electrical connector terminating said wiring harness further end;

first testing means electrically connected to said first device mating electrical connector for electrically testing whether an electrical connector connected to first device mating connector has a certain electrical characteristic possessed by only one of said electrical connector terminating said wiring harness first end and said further electrical connector terminating said wiring harness further end;

means electrically connected to said first device mating electrical connector for transmitting characteristic-defining data signals onto said wiring harness from said first device if said first testing means reveals said electrical connector connected to said first device mating connector has said certain electrical characteristic, and for otherwise receiving characteristic-defining data signals from said wiring harness with said first device;

second testing means electrically connected to said second device mating electrical connector for electrically testing whether an electrical connector connected to second device mating connector has said certain electrical characteristic; and means electrically connected to said second device mating electrical connector for transmitting characteristic-defining data signals onto said wiring harness from said second device if said second testing means reveals said electrical connector connected to said second device mating connector has said certain electrical characteristic, and for otherwise receiving characteristic-defining data signals from said wiring harness with said second device.

25. A digital radio communications device including:
(a) radio frequency circuit means for transmitting and/or receiving radio frequency signals;
(b) first non-volatile memory means for storing characteristic-defining digital signals;
(c) digital signal processing means, connected to said radio frequency circuit means and to said first memory means, for controlling said radio frequency circuit means to operate in a certain manner in response to said characteristic-defining digital signals stored in said first memory means; and
(d) cloning means, adapted for coupling to a further digital radio communications device having a further memory means and a further radio frequency circuit means, for copying characteristic-defining digital signals from: (i) one of said first memory means and said further digital radio communications device further memory means into (ii) the other of said first memory means and said further digital radio communications device further memory means, said copied characteristic-defining digital signals resulting in both said first radio frequency circuit means and said further digital radio communications device radio frequency circuit means to operate in said certain manner 26. A digital radio communications device as in claim 25 wherein said copying means includes uni-directional wiring harness means for temporarily electrically connecting said first and further memory means together and for communicating said characteristic-defining digital signals in a single direction between said first and said further memory means.

27. A digital radio communications device comprising:
radio frequency circuit means for processing radio frequency signals;
first memory means for storing digital signals defining a characteristic of the operation of said radio frequency circuit means;
digital signal processing means, connected to said first memory means and to said radio frequency circuit means, for controlling said radio frequency circuit means to operate in accordance with said characteristics-defining digital signals stored in said first memory means; and
cloning means, adapted for temporary connection between said device and a further digital radio communications device having a further, preprogrammed memory means, for reading said characteristic-defining digital signals from said further memory means and for storing said read characteristic-defining digital signals into said first memory means to thereby cause certain characteristics of the operation of said device and said further device to become substantially identical.

28. A digital radio communications device comprising:
radio frequency circuit means for processing radio frequency signals;
first memory means for storing digital signals defining a characteristic of the operation of said radio frequency circuit means;
digital signal processing means, connected to said first memory means and to said radio frequency circuit means, for controlling said radio frequency circuit means to operate in accordance with characteristic-defining digital signals stored in said first memory means; and
cloning means, adapted for temporary connection between said device and a further digital radio communications device having a further memory means, for reading said characteristic-defining digital signals from said first memory means and for storing said characteristic-defining digital signals into said further memory means to thereby make certain characteristics of the operation of said device and said further device substantially identical.

29. A radio frequency communications system comprising:
(a) a first digital radio communications device including:
first radio frequency circuit means for transmitting radio frequency signals to a second digital radio communications device and for receiving radio frequency signals transmitted by said second digital radio communications device, first memory means for storing digital signals defining a characteristic of the operation of said first radio frequency circuit means, and first digital signal processing means, connected to said first memory means and to said first radio frequency circuit means, for controlling said first radio frequency circuit means to operate in accordance with said characteristic-defining digital signals stored in said first memory means;

(b) said second digital radio communications device including:

second radio frequency circuit means for transmitting radio frequency signals to said first communications device and for receiving radio frequency signals transmitted by said first communications device, second memory means for storing digital signals defining a characteristic of the operation of said second radio frequency circuit means, and second digital signal processing means, connected to said second memory means and to said second radio frequency circuit means, for controlling said second radio frequency circuit means to operate in accordance with said characteristic-defining digital signals stored in said second memory means; and (c) cloning means, operatively coupling said first and second radio communication devices together, for controlling said first processing means to read said characteristic-defining digital signals stored in said first memory means, for communicating said read characteristic-defining digital signals to said second communications device, for controlling said second processing means to store said communicated characteristic-defining digital signals into said second memory means, and for thereby preprogramming said second radio frequency circuit means to operate in a substantially identical manner with respect to said characteristic as said first radio frequency circuit means.

30. A system as in claim 29 wherein:

said first digital signal processing means is preprogrammed so as to operate alternately in a first and a second mode, said first processing means reading characteristic-defining digital signals stored in said first memory means and communicating said read signals to said second digital signal processing means when operating in said first mode, said first processing means receiving characteristic-defining digital signals communicated thereto by said second digital signal processing means and storing said communicated characteristic-defining digital signals in said first memory means when operating in said second mode;

said second digital signal processing means is preprogrammed so as to operate alternately in said first and said second mode, said second processing means reading characteristic-defining digital signals stored in said second memory means and communicating said read characteristic-defining digital signals to said first digital signal processing means when operating in said first mode, said second processing means receiving characteristic-defining digital signals communicated thereto by said first digital signal processing means and storing said communicated characteristic-defining digital signals in said second memory means when operating in said second mode; and said cloning means is connected between said first and second digital signal processing means, controls said first and second processing means to operate in different modes, and communicates said characteristic-defining digital signals between said first and second processing means.

31. A system as in claim 29 wherein:

said cloning means includes a cable having first and second ends, said first end terminating in a connector adapted for connection to either of said first and second processing means, said second end terminating in a further connector adapted for connection to either of said first and second processing means, said cable communicating characteristic-defining digital signals between said first and second processing means;

said first digital signal processing means in preprogrammed so as to operate in said first mode whenever said cable first end is connected thereto and to operate in said second mode whenever said cable second end is connected thereto; and said second digital signal processing means is preprogrammed so as to operate in said first mode whenever said cable first end is connected thereto and to operate in said second mode whenever said cable second end is connected thereto.

32. A system as n claim 31 wherein:

said cable first and second ends are mechanically identically and electrically different; and said first processing means is preprogrammed to test whether said cable first end is connected to said first processing means, and to test whether said cable second end is connected to said first processing means; and said second processing means is also preprogrammed to test whether said cable first end is connected to said second processing means, and to test whether said cable second end is connected to said second processing means.

33. A method of programming digital radio communications device having radio frequency circuit means for transmitting and/or receiving radio frequency signals, digital signal processing means connected to said circuit means for controlling the operation of said circuit means in accordance with digital control signals applied thereto, and non-volatile memory means connected to said processing means for storing said digital control signals and for applying said stored digital control signals to said processing means, said method comprising the steps of:

(a) providing a first communications device having digital control signals stored in the non-volatile memory means thereof;

(b) temporarily establishing a digital data communications path between said first communications device memory means and a further memory means of a further communications device;

(c) reading said digital control signals stored in said first device memory means;

(d) communicating said read digital control signals to said further communications device via said temporary communications path;

(e) storing said communicated digital control signals in said further memory means so as to cause said first and further memory means to store substantially identical digital control signals;

(f) after said storing step (e), eliminating said digital data communications path established by said establishing step (b); and (g) operating both said first and said further communications devices in a substantially identical manner in response to said digital control signals now commonly stored in both said first and further memory means.

34. A method as in claim 33 wherein:

said first and second device memory means each include storage locations preassigned to store said digital control signals;

said storing step (a) stores said digital control signals in the preassigned storage locations of said first device memory means; and said storing step (e) stores said communicated control signals into storage locations of said second device memory means which correspond to said first device memory means preassigned storage locations.

35. A method as in claim 18 wherein said stored digital data specifies at least one radio frequency channel and said controlling step includes controlling said radio frequency circuit means to operate on said at least one radio frequency channel specified by said stored digital data.

36. A method as in claim 18 wherein said stored digital data specifies an audio modulation tone, and said controlling step includes controlling said radio frequency circuit means to transmit and/or decode said audio modulation tone specified by said stored digital data.

37. A device as in claim 27 wherein:

said radio frequency circuit means transmits and receives radio signals over radio frequencies preset by said digital signals stored in said first memory means; and said cloning means causes said device and said further device to operate on substantially identical preset radio frequencies.

38. A device as in claim 28 wherein:

said radio frequency circuit means transmits and receives radio signals over radio frequencies preset by said digital signals stored in said first memory means; and said cloning means causes said device and said further device to operate on substantially identical preset radio frequencies.

39. A system as in claim 29 wherein:

said first and second radio frequency circuit means transmit and receive radio frequency signals on radio frequencies preset by said digital signals stored in said first and second memory means, respectively; and said cloning means is also for causing said first and second devices to operate on substantially identical preset radio frequencies.

40. A system as in claim 33 wherein said operating step (g) includes controlling said radio frequency circuit means of said first and further devices to operate on the same preset radio frequency channels in response to said digital control signals commonly stored in both said first and second memory means.

* * * * *